United States Patent [19]

Schrenk

[11] Patent Number: 4,638,457

[45] Date of Patent: Jan. 20, 1987

[54] METHOD AND APPARATUS FOR THE NON-VOLATILE STORAGE OF THE COUNT OF AN ELECTRONIC COUNTING CIRCUIT

[75] Inventor: Hartmut Schrenk, Haar, Fed. Rep. of Germany

[73] Assignee: Siemens Aktiengesellschaft, Berlin and Munich, Fed. Rep. of Germany

[21] Appl. No.: 383,196

[22] Filed: May 28, 1982

[30] Foreign Application Priority Data

Jun. 12, 1981 [DE] Fed. Rep. of Germany ....... 3123444

[51] Int. Cl.$^4$ .............................................. G11C 7/00
[52] U.S. Cl. ................................... 365/189; 365/230; 365/236
[58] Field of Search ............... 365/189, 230, 233, 236; 307/465

[56] References Cited

U.S. PATENT DOCUMENTS 3,849,634 11/1974 Saltini et al. ...................... 365/230

Primary Examiner—Joseph A. Popek
Attorney, Agent, or Firm—Herbert L. Lerner; Laurence A. Greenberg

[57] ABSTRACT

Method for the non-volatile storage of the count of an electronic counting circuit in which the respective count is stored by electrically reprogramming a non-volatile data memory, which includes writing the respective new count data into the data memory prior to erasure of old count data in the data memory and, between individual steps required to reprogram the data memory, writing or erasing storage cells of a non-volatile control memory having logic states from which control information for completion of an interrupted reprogramming operation is derivable, and an apparatus for carrying out the method.

14 Claims, 2 Drawing Figures

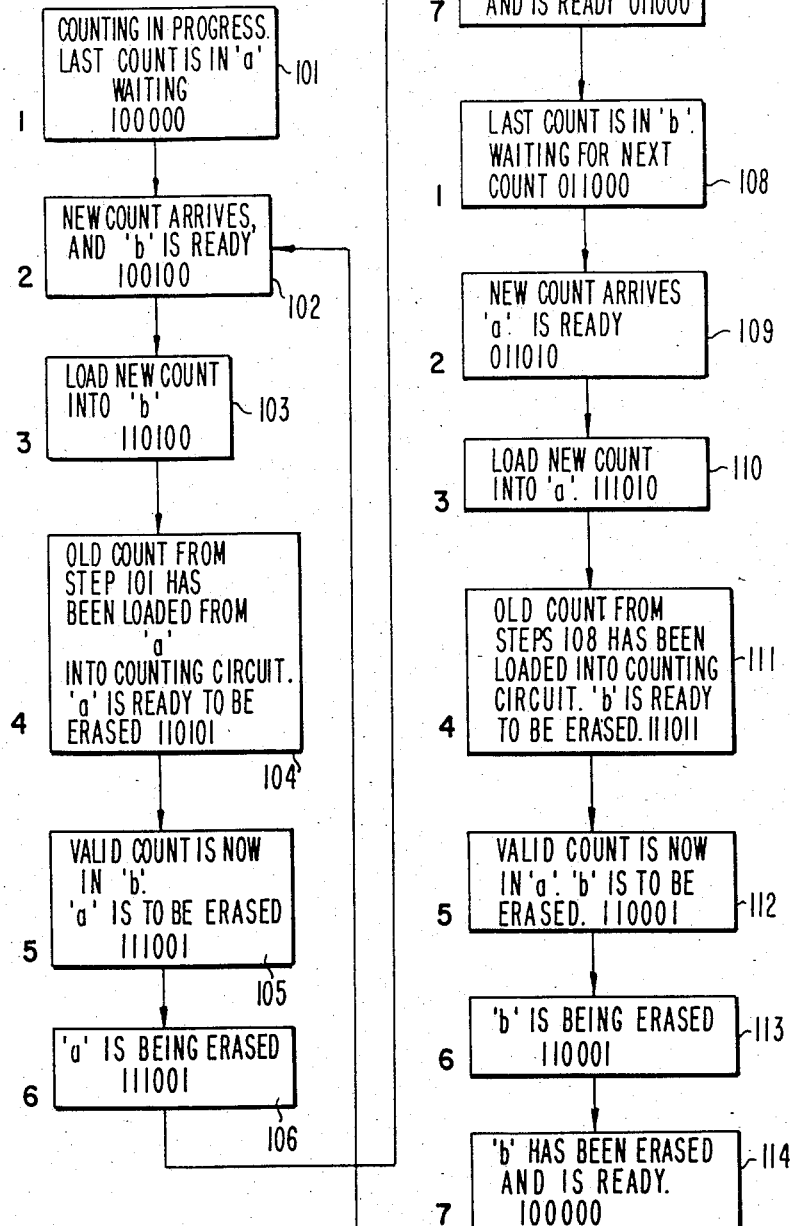

METHOD AND APPARATUS FOR THE NON-VOLATILE STORAGE OF THE COUNT OF AN ELECTRONIC COUNTING CIRCUIT

BACKGROUND OF THE INVENTION

1. Field of the Invention

The invention relates to a method and to an apparatus for the non-volatile storage of the count of an electronic counting circuit in which the respective count is stored by electrically reprogramming a non-volatile data memory.

2. Description of the Prior Art

In the field of counting technology, especially in the automotive industry, mechanical counters are usually used, e.g. as odometers, in which the retention or storage of the respective count is unproblematical. With the development of non-volatile, electrically reprogrammable memories (EEPROMs) as in the known random access memories (RAMs), it has become possible to vary the stored information on one hand, while on the other hand it is also possible to store the changed information without the need for maintaining a supply voltage, as in the known read-only memories (ROMs). Thus, EEPROMs combine the desirable characteristics of both memory types, for which reason they can basically be applied wherever the changing data must be protected even after the supply voltage is shut off. They therefore are particularly well suited for the non-volatile storage of the count of an electronic counting circuit.

However, EEPROMs require a reprogramming time which ranges between 1 ms and 1 s in commercially available EEPROMs. This characteristic is an obstacle to reliable data protection in case of an unforeseen shut-off of the supply voltage, e.g. in case of a power-supply breakdown, because the stored information is undefined during the reprogramming period. If, in case of a breakdown, for instance, the supply voltage is shut off while reprogramming, the old as well as the new information may be lost in the memory area addressed.

This risk can be reduced by operating the EEPROM, together with the addressing circuits required, with a separate circuit fed by its own battery or by a suitable storage capacitor, making the non-volatile storage by and large independent of the extraneously supplied voltage. However, remaining disadvantages are not only an increased residual risk as to the dependability of the data protection, particularly after several brief supply voltage dips in short succession, but also the expense of its own supply circuit for the completion of a programming operation after a shut-off of the external supply voltage.

It is accordingly an object of the invention to provide a method and apparatus for the non-volatile storage of the count of an electronic counting circuit which overcomes the hereinafore-mentioned disadvantages of the heretofore-known methods and devices of this general type, and which allows safe storage of the count even when supply voltage dips occur, without requiring an additional circuit.

SUMMARY OF THE INVENTION

With the foregoing and other objects in view there is provided, in accordance with the invention, a method for the non-volatile storage of the counts of an electronic counting circuit in which the respective counts are stored such that the respective new count data are written into the data memory prior to erasure of old count data in the data memory and such that, between the individual steps required to reprogram the data memory, the new count data are written into storage cells of a non-volatile control memory having logic states from which control information for completion of an interrupted reprogramming operation can be derived.

Since the information change in the data memory in which the respective count is registered in a non-volatile manner is performed in such a way that the new count is stored first, prior to the erasure of the old count information, the correct count information remains intact in case of a supply voltage interruption while the new count is being stored.

Uncertainties as to which of several pieces of information found in the data memory are valid after a storage operation has been disturbed are avoided because if the count changes between the individual reprogramming steps (entering the new information, erasing the old information), a control memory is additionally programmed and erased. If the reprogramming operation is interrupted, information can be determined unambiguously from the logic states of one or more control data cells, e.g. by means of a decoding circuit, after the return of the supply voltage, as to which address area of the data memory contains valid information or how valid information can be reconstructed from the not yet erased preceding information and how the interrupted reprogramming operation can be subsequently completed. The reprogramming of the data memory, can therefore be broken off in any state without the loss of information.

In accordance with another mode of the invention, there is provided a method which comprises obtaining control information for completion of an interrupted reprogramming operation by means of a logic arithmetic processing of data stored in the data memory.

To allow an increase in the counting rate in accordance with another mode of the invention, there is provided a method which comprises performing the reprogramming operation solely upon every $n^{th}$ count change.

In accordance with the teachings of the invention, there is provided advantageously, an apparatus for carrying out a method for the non-volatile storage of the count of an electronic counting circuit, comprising a cycle control connected to the counting circuit, at least one electrically reprogrammable non-volatile data memory for storing a count being connected to the counting circuit through the cycle control, and a non-volatile control memory being connected to the cycle control and having storage cells being writeable and erasable depending upon the individual steps required to reprogram the data memory.

In accordance with a further feature of the invention, the data memory includes at least two address areas in which count data can be alternately written.

In accordance with an added feature of the invention, the control memory includes a first storage cell, from which information as to which of the address areas of the data memory is storing a valid count, can be derived based on the logic state of the first storage cell.

In accordance with an additional feature of the invention, the control memory includes a second storage cell, from which information as to whether or not a writing operation involving a first one of the address areas of the data memory has been interrupted, can be derived, based on the logic state of the second storage cell.

In accordance with again another feature of the invention, the control memory includes at least one other storage cell, from which information as to whether or not a writing operation involving another of the address areas of the data memory has been interrupted, can be derived, based on the logic state of the at least one other storage cell.

In accordance with again a further feature of the invention, the control memory includes an erase storage cell, from which information as to whether or not an erase operation has been interrupted after a completed writing operation, can be derived from the logic state of the erase storage cell.

In accordance with again an added feature of the invention, there is provided an electrically reprogrammable non-volatile memory having memory cells being subdivided into areas for the data memory and areas for the control memory.

Due to the fact that basically, for every supply voltage dip there is a possibility of a change of the data just processed, there is provided in accordance with again an additional feature of the invention, a sensor circuit connected to the cycle control for furnishing a break-off signal to the cycle control upon the occurence of a supply voltage dip. The voltage sensor may also furnish the starting signal for all necessary operations upon the return of the supply voltage.

In accordance with again an additonal mode of the invention, there is provided a method for the non-volatile storage of the count of an electronic counting circuit in which the respective count is stored by electrically reprogramming a non-volatile data memory, which comprises scanning at least four address areas of the date memory in a fixed order for reprogramming and reading out the count, transferring count data of a new counting event to one of the address areas following an address area for the count of a preceding counting event when reprogramming the data memory, and subsequently erasing an address area in which the count of the counting event prior to the preceding counting event is stored.

In accordance with yet another mode of the invention, there is provided a method which comprises transferring the count to be read out later in the fixed order to the counting circuit when the reprogramming operation is interrupted and two address areas are occupied, and transferring the count of the address area in the middle of the fixed order increased by "1" to the counting circuit, when three address areas are occupied.

In accordance with a concomitant feature of the invention, there is provided an apparatus for carrying out a method for the non-volatile storage of the count of an electronic counting circuit, comprising a cycle control connected to the counting circuit, an electrically reprogrammable non-volatile data memory being connected to the counting circuit through the cycle control and including at least four address areas, and a scoring logic connected to the cycle control and the data memory for furnishing control information for the completion of an interrupted reprogramming operation by logic arithmetic processing of data stored in the data memory.

In the data processing literature, e.g. the publication by A. Osborne, entitled "Einführung in die Mikrocomputertechnik" (Introduction to Microcomputer Technology), 1977, te-wi Verlag München, the marking or influencing of the flow of a program through the logic state of specifically assigned registers is also called the setting or resetting of "flags". According to the invention, these flag registers, which are set or reset during the reprogramming of the data memory in the control memory, are not volatile. Therefore, the storage cells of the control memory are hereinafter called flag registers or flags. Other features which are considered as characteristic for the invention are set forth in the appended claims.

Although the invention is illustrated and described herein as embodied in a method and apparatus for the non-volatile storage of the count of an electronic counting circuit, it is nevertheless not intended to be limited to the details shown, since various modifications and structural changes may be made therein without departing from the spirit of the invention and within the scope and range of equivalents of the claims.

BRIEF DESCRIPTION OF THE DRAWINGS

The construction and method of operation of the invention, however, together with additional objects and advantages thereof will be best understood from the following description of specific embodiments when read in connection with the accompanying drawings, in which.

DETAILED DESCRIPTION OF THE PREFERRED EMBODIMENTS

Figure 1:
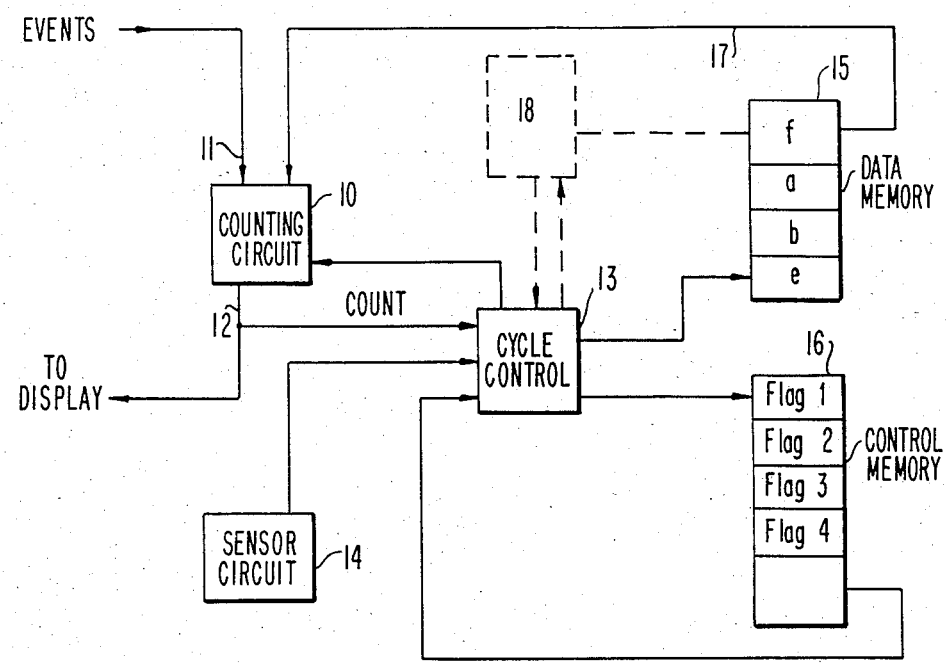
FIG. 1 is a schematic block diagram of one embodiment of an apparatus for the execution of a method according to the invention.

Referring now to the figures of the drawing and first particularly to FIG. 1 thereof, there is seen a counting circuit 10, e.g. a commercially available counter, which assumes the function of counting the individual events or occurrences applied to the counting input 11. The count can, for instance, be displayed in a display, by way of an output 12 of the counter, possibly using a suitable recording circuit. The count taken from the output 12 of the counting circuit 10 is fed to a data memory 15 through a cycle control 13. The data memory 15, serving to receive the counter information, is a commercial, electrically programmable and erasable read only memory (EEPROM), such as is known from the publication by W. Söll and J. H. Kirchner, entitled "Digitale Datenspeicher" (Digital Data Memories), 1978, Vogel-Verlag, Würzburg, pages 160 to 163, and is equipped with control inputs for controlling the reprogramming cycle. The data memory 15 has two address areas "a" and "b", respectively, in which the latest status of the counting circuit 10 is alternately stored and the preceding count is erased. A control memory 16, driven by the cycle control 13, may likewise be a commercial EEPROM. However, it is also possible to dispose the control memory 16 in a separate address area "f" of the data memory 15. Each flag marking the control memory 16 requires at least one storage cell, i.e. one data bit.

The sensor circuit 14 driving the cycle control 13 recognizes a supply voltage dip and furnishes a suitable break off signal to the cycle control 13. The sensor circuit 14 may also be constructed in such a way as to furnish a break off signal at voltage peaks ("spikes") of the supply circuit. Upon the activation of the apparatus according to the invention, the sensor circuit 14 also transmits a starting signal for the interrogation of the control memory 16. It may be constructed in accordance with the reset circuits commonly used in microcomputers (such as in the publication by U. Tietze and CH. Schenk, entitled "Halbleiter-Schaltungstechnik" (Semiconductor Circuitry), Springer-Verlag, Berlin, Heidelberg, New York, 1980, pages 558 and 559.

The cycle control 13 provides, from the outputs of the counting circuit 10, the sensor circuit 14, and the control memory 16, the output signals required, according to the invention, for control of the programming cycle. It may be constructed, in a known manner, as a programmable logic array (PLA, such as is described in the publication by U. Tietze and CH. Schenk, pages 177 to 179). It is also possible to have a commercial microprocessor carry out by means of software the control functions of the cycle control 13.

When using an appropriate microprocessor, the entire apparatus according to the invention can be constructed with a microprocessor and an electrically reprogrammable, non-volatile memory. However, it is also possible to integrate the circuit components required in one or more circuits that are specific to the particular application.

The reprogramming cycle of the data memory 15 is illustrated in Table 1. Table 1 shows the reprogramming cycle of the data memory 15 in a counting apparatus according to the invention in which the state of the data memory 15 during the reprogramming is marked by four flag registers (flag 1, flag 2, flag 3, and flag 4), i.e. by four non-volatile flag storage cells in the control memory 16. In the specific case illustrated, the flag 1 serves for marking a valid or available address. If the data bit of the flag 1 is "0" ("low"), the valid or available count is stored in the address area "a" of the data memory 15; if the data bit of the flag 1 is "1", the valid or available count is stored in the address area "b" of the data memory 15. The flag 2 serves to provide the write state in the writing process for the address area "b", while the flag 3 serves the same function for the address area "a". If a write operation has been initiated and is in process in the address area "b" of the data memory 15, the flag 2 equals "1". The condition of the flag 2 being equal to "0" indicates that a write operation has been concluded in the address area "b". The analogous situation applies to the flag 3 and the address area "a".

To indicate an erase operation in progress within the address area "a" or address area "b", the flag 4 is used in such a way as to be "1" in the case of an erase operation being in progress in one of the address areas "a" or "b" while being "0" indicates the opposite condition.

The individual steps numbered 1 to 7 of the reprogramming operation described above are shown in the first column of Table 1.

Alternately entered in the address area "a" and "b", respectively, is the old and new information on the count of the counting circuit 10. In regular operation, i.e. without supply voltage interruption, the correct value after each count change can be read out of the address area "a" or "b" of the data memory 15 as determined by the flag 1. The flag state 0000 in the control memory (flag 1=0, flag 2=0, flag 3=0, flag 4=0) means, therefore, that the valid or available count is stored in the address area "a" while the address area "b" is erased.

At this point, the apparatus according to the invention is ready for counting (step 1), an arriving counting pulse can be processed without error. However, if one of the three flag registers flag 2, flag 3, or flag 4 is set, i.e. they have the logic state "1" during the readout from the control memory 16, it follows that the programming operation has not been completed properly.

A flag state 0100 in the control memory 16 according to step 2 (write request for address area "b") or step 3 (store new count in address area "b") means that after the reactivation of the counting circuit following a supply voltage dip a write operation in address area "b" was interrupted, corresponding to the flag state 1010 in the case of the address area "a". In that case (flag state 0100), the cycle control 13 is controlled, possibly through a flag decoding circuit which is inserted between the output of the control memory 16 and the input of the cycle control 13 and determines the control signals required to run the reprogramming operation from the logic state of the flag registers. The control is carried out in such a way that instead of the count in the address area "b", the as yet unerased old count of the address area "a" is read out. It is with this old count that the counting circuit 10, e.g. one constructed as a preselect counter, is set through the data line 17 coming from the data memory 15. After adding a counting pulse initiated by the cycle control 13, the counting circuit 10 will contain the correct count. Therefore, after the return of the supply voltage, the reprogramming operation can be repeated and properly concluded according to Table 1.

If, according to steps 4 (acknowledge write end for address area "b", set flag 4) and 4a (change the valid or available address area; change flag 1), a write flag (flag 2 or flag 3) and an erase flag (flag 4) are registered as being set at the same time, the address area of the available or valid count information cannot be learned from the flag 1 because it is not known whether or not the flag 1 had already been switched. Rather, the correct address area is indicated by the state of the flags 2 or 3 so that the flag decoder will recognize in both cases that a new count is correctly written into the address area "b" or "a" of the data memory 15, whereas the programming operation was not properly concluded. The same applies if only the erase flag (flag 4) was set when the supply voltage returned. After their detection, the missing steps are repeated through the cycle control 13.

The flag states in the control memory 16 for the steps 5 (erase request address area "a", reset the flag 2), 6 (erase old information in address area "a"), and 7 (acknowledge erase end, reset the flag 4) are likewise evident from Table 1. The appropriate reprogramming cycle of the data memory 15 to reprogram from address area "b" to address area "a" is shown in the lower half of Table 1.

Irrespective of the step at which the programming operation was interrupted during reprogramming, the correct count for the counting circuit 10 after the return of the supply voltage is determined by the method according to the invention. The sole possible source of error is the dead time lasting from directly after arrival of a counting pulse to the setting of a write flag (flag 2, flag 3). However, this error involves at most one single counting pulse. When using the four flags described above, a scoring logic circuit 18, shown in broken lines in FIG. 1, which is driven by the data memory 15 and has an output which drives the cycle control 13, is not required. However, in a modified embodiment of the counting circuit according to the invention, it is also possible to recover, for instance, the valid or available address information by means of the scoring logic 18 from the information contained in the data memory 15 instead of from the flag 1. The information of both address areas "a" and "b" is then utilized for the readout. For instance, it can be determined through logic operations with the content of both address areas "a" and "b", whether the content of an address area "a" or "b" is or is not "0" and whether the content of one address area is larger than the content of the other. The valid or available address area is recognized, for example, by its content being larger than "0" (the other address area has already been erased), or by the content in the valid or available address area being larger than the content in the other address area (old count). In exceptional cases, errors can occur when a counter overflows with a correct readout "0".

Reprogramming the data memory 15, alternating with the control memory 16, prolongs the overall programming time in comparison with the minimum storage operation. In those cases in which the counting rate is critical, this disadvantage can be avoided by only performing the reprogramming operation at every $n^{th}$ count change. For example, if only every tenth or every hundredth counting pulse triggers the hereinaforedescribed reprogramming operation according to the invention, with setting of the flags, the inbetween pulses can be registered, e.g. singly, in a separate address area "e" of the data memory 15. When reading out, the correct count then ensues only as the sum of the two part memories "a" and "e" or "b" and "e". In addition to a shortening of the mean reprogramming time, this also results in a lower reprogramming frequency of each individual storage cell of the data memory 15. At the same time, this reduces the problem of the limited number of permissible reprogramming operations of all EEPROMs commercially available at the present.

A corresponding "single" storage operation with a special one of n code is adavantageously carried out so that only one other bit is additionally written into the new, fixed memory address (address area "e") with each new counting pulse:
e.g.
- count z: storage according to the invention with flag setting
- count z+1: single storage 000 000 001
- count z+2: single storage 000 000 011
- count z+3: Single storage 000 000 111, etc.

Thus, there is no erasure between the single pulses so that no information can be falsified. The correct count still ensues from counting the ones and adding this value to the status of address area "a" and "b". Because of the memory space requirement associated with the "single" storage, n is advantageously chosen between 10 and 100.

Due to the fact that a non-volatile control memory 16 is used after the activation of the counting apparatus according to the invention when a reprogramming process is interrupted or disturbed, it can be unambiguously reconstructed from the logic states of one or more cells of the control memory 16. This address area of the data memory contains valid or available information, or tells how valid or available information is gained from the not as yet erased perceding information, and how the interrupted reprogramming operation can be concluded afterwards. Consequently, reprogramming the data memory can be broken off at any time without the loss of information and can be completed at a later time.

Figure 2:
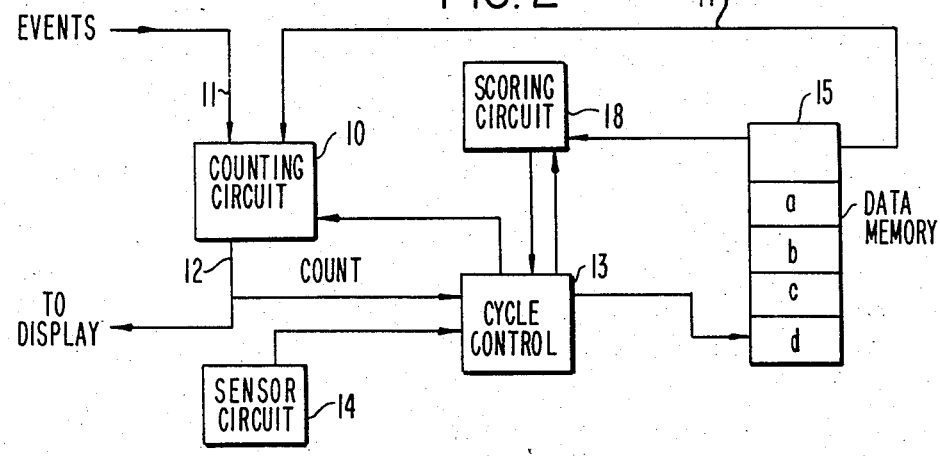
FIG. 2 is a schematic block diagram of another method for solving the problem underlying the objects of the invention.

FIG. 2 shows a schematic block circuit diagram of an embodiment example for the execution of another method suited for solving the problem underlying the objects of the invention. The same reference symbol found in FIG. 1 are used in FIG. 2 for identical elements. The setting or resetting of special flag registers is eliminated in this method for the non-volatile storage of the count of an electronic counting circuit.

All control information that is required is taken solely from the data memory 15, which is driven by the cycle control 13 and is connected to the cycle control 13 through the scoring logic 18. In this case, the count data are stored in the data memory 15 repeatedly, i.e. with increased redundancy.

In the embodiment example shown, the storage of the count data requires four equivalent address areas "a", "b", "c", "d" in the data memory 15 constructed as an EEPROM. These address areas are always traversed in a fixed order, such as cyclically ascending. This applies to the reprogramming operation upon a count change as well as to the readout of the memory 15. Basically, when reprogramming the memory 15, the new count information (e.g. z+1) is transferred to the next address area according to the fixed order before the count information (count z−1) preceding the old count (z) is erased. Therefore, fundamentally, at least two address areas contain information.

Table 2 illustrates the cycle of a reprogramming operation from count z to count z+5 with the data contents of the four address areas "a", "b", "c", "d" which are traversed cyclically, and with the individual reprogramming steps.

At count z, the apparatus according to the invention is in counting readiness (step 1, standby). The old count z−1 is stored in the address area "a", the actual (valid) count z in the address area "b"; the address areas "c" and "d" are erased. If a counting pulse (count z+1) now appears, the new count is first transferred to the address area "c" (step 2) and stored (step 3). In step 4, the old count in the address area "a" is erased, in step 5 the address area "a" is erased and the new count is transferred as valid or available. The transfer of the next counts z+2, z+3, z+4, and z+5 to the address areas "a", "b", "c", "d" occupied in cyclically ascending order is evident from the next following sections of Table 2.

Accordingly, two of the four address areas "a", "b", "c", "d" are occupied when the storage operation is completed properly. The upper one of the two address areas in the fixed order, i.e. the one which is read out later, e.g., in a cyclic readout, contains the valid, actual count, and the preceding address area contains a data value reduced by 1. In contrast, after the storing operation has been interrupted, such as by a supply voltage dip, three of the address areas "a", "b", "c", "d" contain information other than "0". In this case, the valid information, i.e. the count that is valid after the reactivation of the counting circuit, can be determined as follows:

The second occupied address area after the unoccupied address area, i.e. the middle one of the three occupied address areas in the given order, contains a count information in any case which is undisturbed, although it is lower by one counting pulse. By transferring this value to the counting circuit 10 and by complementing the missing pulses through the cycle control 13, the correct count has been recovered. The storing operation, i.e. writing the third and erasing the first address area after the unoccupied address area, can be repeated through the cycle control 13.

In this manner, success is also achieved in recovering the valid information from preceding information not yet erased after the reactivation of the counting apparatus according to the invention, after an interruption of the reprogramming operation, and in completing the reprogramming operation afterwards.

The foregoing is a description corresponding to German Application No. P 31 23 444.5, dated June 12, 1981, the International priority of which is being claimed for the instant application, and which is hereby made part of this application. Any discrepancies between the foregoing specification and the aforementioned corresponding German application are to be resolved in favor of the latter.

ming operation and from which in case of interruption of said programming operation, the completion of said reprogramming operation is derived by logical arithmetic processing of said control information.

2. Method according to claim 1, which comprises obtaining control information for completion of an interrupted reprogramming operation by logic arithmetic processing of data stored in the data memory.

3. Method according to claim 1, which comprises performing the reprogramming operation solely in response to every $n^{th}$ count charge.

4. Apparatus for non-volatile storage of the counts of an electronic counting circuit, comprising a cycle control connected to the counting circuit for performing programming steps, at least one electrically reprogrammable non-volatile data memory for storing suc-

TABLE 1

| | | Data Memory Address Area | | | Control Memory | | | |
|---|---|---|---|---|---|---|---|---|
| Non-volatile Storing Cycle | | a | b | Valid | Flag 1 | Flag 2 | Flag 3 | Flag 4 |
| 1 | Standby (counting readiness) arrival counting pulse | $\neq 0$ | 0 | a | 0 | 0 | 0 | 0 |
| 2 | Write request address area b (set flag 2) | $\neq 0$ | 0 | a | 0 | 1 | 0 | 0 |
| 3 | Determine new count & store in address area b | $\neq 0$ | $\neq 0$ | a | 0 | 1 | 0 | 0 |
| 4 | Acknowledge write end for address area b (set flag 4) | $\neq 0$ | $\neq 0$ | a | 0 | 1 | 0 | 1 |
| 4a | Change valid address area (change flag 1) | $\neq 0$ | $\neq 0$ | b | 1 | 1 | 0 | 1 |
| 5 | Erase request address area a (reset flag 1) | $\neq 0$ | $\neq 0$ | b | 1 | 0 | 0 | 1 |
| 6 | Erase old information a | $\neq 0$ | $\neq 0$ | b | 1 | 0 | 0 | 1 |
| 7 | Acknowledge erase end and standby | 0 | $\neq 0$ | b | 1 | 0 | 0 | 0 |
| 1 | Standby (counting readiness) counting pulse | 0 | $\neq 0$ | b | 1 | 0 | 0 | 0 |
| 2 | Write request address area a (set flag 3) | 0 | $\neq 0$ | b | 1 | 0 | 1 | 0 |
| 3 | Determine new count, store in a | $\neq 0$ | $\neq 0$ | b | 1 | 0 | 1 | 0 |
| 4 | Acknowledge write end for address area a (set flag 4) | $\neq 0$ | $\neq 0$ | b | 1 | 0 | 1 | 1 |
| 4a | Change valid address area (change flag 1) | $\neq 0$ | $\neq 0$ | a | 0 | 0 | 1 | 1 |
| 5 | Erase request address area b (reset flag 3) | $\neq 0$ | $\neq 0$ | a | 0 | 0 | 0 | 1 |
| 6 | Erase old count in b | $\neq 0$ | $\neq 0$ | a | 0 | 0 | 0 | 1 |
| 7 | Acknowledge erase end and standby | $\neq 0$ | 0 | a | 0 | 0 | 0 | 0 |

TABLE 2

| Count | Data in a → b → c → d | | | | Step, Operation | |
|---|---|---|---|---|---|---|
| Z | Z − 1 | Z | 0 | 0 | 1. Standby | |
| Z + 1 | Z − 1 | Z | $\neq 0$ | 0 | 2. Store new count | |
| Z + 1 | Z − 1 | Z | Z + 1 | 0 | 3. New count stored | Reprogram |
| Z + 1 | $\neq 0$ | Z | Z + 1 | 0 | 4. Erase old count | |
| Z + 1 | 0 | Z | Z + 1 | 0 | 5. New count valid | |
| Z + 2 | 0 | $\neq 0$ | Z + 1 | $\neq 0$ | Reprogram according to above steps 2 to 4 | |
| Z + 2 | 0 | 0 | Z + 1 | Z + 2 | Count Z + 2 valid | |
| Z + 3 | $\neq 0$ | 0 | $\neq 0$ | Z + 2 | Reprogram | |
| Z + 3 | Z + 3 | 0 | 0 | Z + 2 | Count Z + 3 valid | |
| Z + 4 | Z + 3 | $\neq 0$ | 0 | $\neq 0$ | Reprogram | |
| Z + 4 | Z + 3 | Z + 4 | 0 | 0 | Count Z + 4 valid | |
| Z + 5 | $\neq 0$ | Z + 4 | $\neq 0$ | 0 | Reprogram | |
| Z + 5 | 0 | Z + 4 | Z + 5 | 0 | Count Z + 5 valid etc. | |

I claim:

1. Method for non-volatile storage of successive old and new counts in an electronic counting circuit in which said counts are stored by electronically reprogramming a non-volatile data memory in a reprogramming operation, which comprises: writing the respective new count data into first storage cells of said data memory prior to erasure of old count data in second storage cells of said first data memory, and during said reprogramming operation writing into storage cells of a non-volatile control memory control information which is indicating the actual state of said reprogramcessive old and new counts being connected to the counting circuit through said cycle control, and a non-volatile control memory for storing and erasing control flags, being operatively connected to said cycle control and having storage cells, for controlling the programming steps of said cycle control, required to reprogram said data memory.

5. Apparatus according to claim 4, wherein said data memory further comprises means for writing count data into said data memory, at least two address areas in which count data can be alternately written.

6. Apparatus according to claim 5, wherein said control memory includes a first storage cell for storing logic state information, said logic state information operatively engaging said cycle control for deriving the validity of the count stored in the address areas of said data memory.

7. Apparatus according to claim 6, wherein said control memory includes a second storage cell for storing logic state information indicating if a writing operation involving a first one of said address areas of said data memory has been interrupted, said information being derived from the logic state of said second storage cell.

8. Apparatus according to claim 7 wherein said control memory includes at least one other storage cell for storing logic state information operatively responsive to said cycle control for indicating if a writing operation involving at least one other one of said address areas of said data memory has been interrupted, said information being derived from the logic state of said at least one other storage cell.

9. Apparatus according to claim 7 wherein said control memory includes an erase control storage cell for storing logic state information indicating if an erase operation has been interrupted after a completed writing operation, said information being derived from the logic state of said erase control storage cell.

10. Apparatus according to claim 4, wherein said data memory and said control memory are combined into a single unitary memory.

11. Apparatus according to claim 4, including a sensor circuit connected to said cycle control for furnishing a break-off signal to said cycle control upon the occurence of a supply voltage dip.

12. Apparatus for non-volatile storage of the count of an electronic counting circuit, the apparatus comprising a cycle control connected to the counting circuit, an electrically reprogrammable non-volatile data memory being connected to the counting circuit through said cycle control and including at least four address areas, a sensor circuit for sensing an interruption of reprogramming of said data memory and a scoring logic connected to said cycle control and said data memory for furnishing control information for the completion of the interruption of the reprogramming operation by logic arithmetic processing of data stored in said data memory.

13. Method for non-volatile storage of successive old and new counts of an electronic counting circuit in which said counts are stored as count data by electronically reprogramming a non-volatile data memory for storing the count data, in a reprogramming operation which comprises: scanning in a fixed order at least four address areas of said data memory for finding an address area following an address containing a new count; writing the count data of a counting event following the new count into said found address following the address area of said new count and subsequently erasing the address area in which said old count is stored.

14. Method according to claim 13, further comprising a sensor circuit for sensing an interruption of a reprogramming operation, transferring the count to be read out later in the fixed order to the counting circuit when the reprogramming operation is interrupted and two address areas are occupied, and transferring the count of the address area in the middle of the fixed order increased by "1" to the counting circuit, when three address areas are occupied.

* * * * *